United States Patent
Matsunaga et al.

(10) Patent No.: US 12,035,469 B2
(45) Date of Patent: Jul. 9, 2024

(54) PURE COPPER PLATE, COPPER/CERAMIC BONDED BODY, AND INSULATED CIRCUIT BOARD

(71) Applicant: MITSUBISHI MATERIALS CORPORATION, Tokyo (JP)

(72) Inventors: Hirotaka Matsunaga, Aizuwakamatsu (JP); Yuki Ito, Ageo (JP); Hiroyuki Mori, Tsukuba (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 110 days.

(21) Appl. No.: 17/909,678

(22) PCT Filed: Mar. 5, 2021

(86) PCT No.: PCT/JP2021/008809
§ 371 (c)(1),
(2) Date: Sep. 6, 2022

(87) PCT Pub. No.: WO2021/177460
PCT Pub. Date: Sep. 10, 2021

(65) Prior Publication Data
US 2023/0114969 A1   Apr. 13, 2023

(30) Foreign Application Priority Data

Mar. 6, 2020   (JP) .................. 2020-038764

(51) Int. Cl.
*H05K 1/09* (2006.01)
*H05K 1/05* (2006.01)
(52) U.S. Cl.
CPC ............. *H05K 1/053* (2013.01); *H05K 1/092* (2013.01)

(58) Field of Classification Search
CPC ........ H05K 1/092; H05K 1/095; H05K 1/097; H05K 1/09; H05K 1/053
See application file for complete search history.

(56) References Cited

U.S. PATENT DOCUMENTS

2013/0071652 A1   3/2013   Yamanashi et al.

FOREIGN PATENT DOCUMENTS

| CN | 103146946 A | 6/2013 |
|---|---|---|
| CN | 103418615 A | 12/2013 |

(Continued)

OTHER PUBLICATIONS

Chinese Office Action dated Apr. 13, 2023 for the corresponding Chinese Patent Application No. 202180018502.5 (13 pages including English translation).

(Continued)

*Primary Examiner* — Jeremy C Norris
(74) *Attorney, Agent, or Firm* — Leason Ellis LLP; Melvin C. Garner; Mitsuhiro Haraguchi

(57) ABSTRACT

A pure copper sheet has a composition including 99.96 mass % or more of Cu, 9.0 mass ppm or more and less than 100.0 mass ppm of a total content of Ag, Sn, and Fe, and inevitable impurities as a balance, in which an average crystal grain size of crystal grains on a rolled surface is 10 μm or more, the pure copper sheet has crystals in which crystal planes parallel to the rolled surface are a {022} plane, a {002} plane, a {113} plane, a {111} plane, and a {133} plane, and diffraction peak intensities of the individual crystal planes that are obtained by X-ray diffraction measurement by a 2θ/θ method on the rolled surface satisfy I {022}/(I {022}+I {002}+I {113}+I {111}+I {133})≤0.15, I {002}/I {111}≥10.0, and I {002}/I {113}≥15.0.

7 Claims, 1 Drawing Sheet

(56) References Cited

FOREIGN PATENT DOCUMENTS

| CN | 103547067 A | 1/2014 |
|---|---|---|
| EP | 4036261 A1 | 8/2022 |
| JP | 62282797 A | 12/1987 |
| JP | 06002058 A | 1/1994 |
| JP | 09316568 A | 12/1997 |
| JP | 2018024930 A | 2/2018 |
| JP | 2018204108 A | 12/2018 |
| WO | 2013027437 A1 | 2/2013 |
| WO | 2018181593 A1 | 10/2018 |
| WO | 2020122112 A1 | 6/2020 |
| WO | 2021060023 A1 | 4/2021 |

OTHER PUBLICATIONS

International Search Report dated May 25, 2021 for the corresponding PCT International Application No. PCT/ JP2021/008809 ( 4 pages including English translation ).
Japanese Office Action dated Oct. 26, 2021 for the corresponding Japanese Patent Application No. 2021-540092 ( 7 pages including English translation ).
European Search Report mailed Feb. 23, 2024 for the corresponding European Patent Application No. 21765332.8 (11 pages).

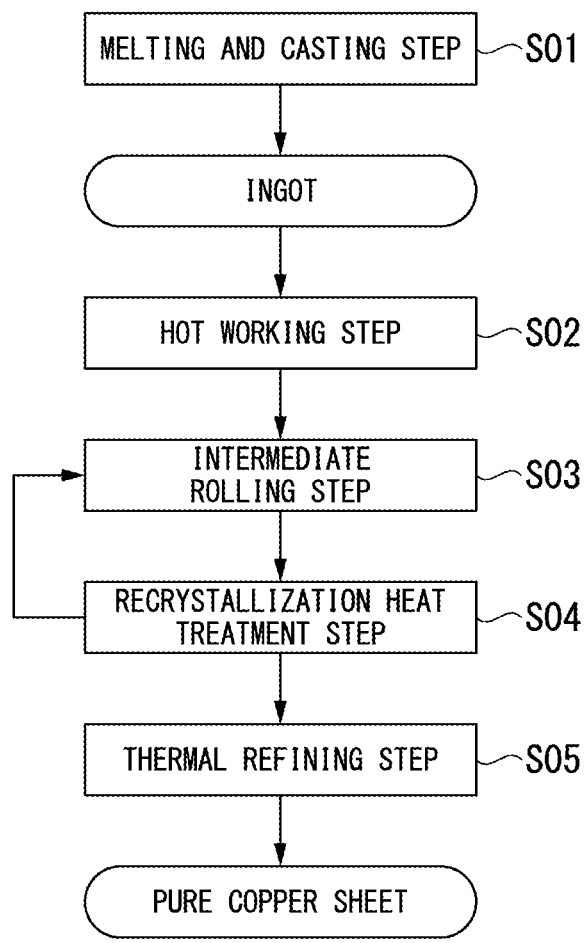

PURE COPPER PLATE, COPPER/CERAMIC BONDED BODY, AND INSULATED CIRCUIT BOARD

CROSS-REFERENCE TO RELATED PATENT APPLICATIONS

This application is a U.S. National Phase Application under 35 U.S.C. § 371 of International Patent Application No. PCT/JP2021/008809 filed on Mar. 5, 2021 and claims the benefit of priority to Japanese Patent Applications No. 2020-038764 filed on Mar. 6, 2020, the contents of all of which are incorporated herein by reference in their entireties. The International Application was published in Japanese on Sep. 10, 2021 as International Publication No. WO/2021/177460 under PCT Article 21(2). CL FIELD OF THE INVENTION The present invention relates to a pure copper sheet suitable for electrical and electronic components such as heat sinks or thick copper circuits, in particular, a pure copper sheet in which coarsening of crystal grains during heating is suppressed, a copper/ceramic joined body and an insulated circuit substrate for which this pure copper sheet is used.

BACKGROUND OF THE INVENTION

Conventionally, highly conductive copper or copper alloy has been used for electrical and electronic components such as heat sinks or thick copper circuits.

Recently, in response to an increase in the current in electronic devices, electric devices, or the like, attempts have been made to increase the sizes and thicknesses of electrical and electronic components that are used in these electronic devices, electric devices, or the like in order for a decrease in the current density and the diffusion of heat attributed to Joule heat generation.

Here, in semiconductor devices, for example, an insulated circuit substrate or the like in which a copper material is joined to a ceramic substrate to form the above-described heat sink or thick copper circuit is used.

At the time of joining the ceramic substrate and a copper sheet, the joining temperature is often set to 800° C. or higher, and there is a concern that the crystal grains of the copper material that forms the heat sink or the thick copper circuit may become coarse during joining. Particularly, in copper materials made of pure copper that is particularly excellent in terms of the conductivity and the heat radiation, there is a tendency that crystal grains are likely to become coarse.

In a case where the crystal grains become coarse in the heat sink or the thick copper circuit after joining, there is a concern that a problem may be caused in terms of the appearance due to the coarsening of the crystal grains.

Here, for example, Japanese Unexamined Patent Application, First Publication No. H06-002058 proposes a pure copper sheet in which the growth of crystal grains is suppressed. Japanese Unexamined Patent Application, First Publication No. H06-002058 describes that, when 0.0006 to 0.0015 wt % of S is contained, it is possible to adjust the crystal grains to a certain size even when a heat treatment is performed at a recrystallization temperature or higher.

CITATION LIST

Patent Document

[Patent Document 1]
Japanese Unexamined Patent Application, First Publication No. H06-002058

Technical Problem

By the way, in Japanese Unexamined Patent Application, First Publication No. H06-002058, the coarsening of the crystal grains is suppressed by specifying the content of S; however, depending on the heat treatment conditions, there is a case where it is not possible to obtain an effect of sufficiently suppressing the coarsening of the crystal grains only by specifying the content of S. In addition, there is a case where, after the heat treatment, the crystal grains locally become coarse and the crystal structure becomes nonuniform.

Furthermore, in the case of increasing the content of S in order to suppress the coarsening of the crystal grains, there is a problem in that the hot workability significantly deteriorates and the manufacturing yield of pure copper sheets significantly deteriorates.

The present invention has been made in view of the above-described circumstances, and an objective of the present invention is to provide a pure copper sheet having a high electrical conductivity and capable of suppressing crystal grains becoming coarse and nonuniform even after a heat treatment and a copper/ceramic joined body and an insulated circuit substrate for which this pure copper sheet is used.

SUMMARY OF THE INVENTION

Solution to Problem

The present inventors performed intensive studies in order to solve this problem and consequently obtained the following finding. Among impurity elements contained in a small amount in a pure copper sheet, there is an element having a crystal grain growth-suppressing effect of suppressing the coarsening of crystal grains by being present at crystal grain boundaries. Therefore, it was found that it is possible to suppress the crystal grains becoming coarse or nonuniform even after a heat treatment by utilizing this element having the crystal grain growth-suppressing effect (hereinafter, referred to as the crystal grain growth-suppressing element). In addition, it was found that, in order to make the action of this crystal grain growth-suppressing element sufficiently exhibited, it is effective to regulate the content of a specific element.

Furthermore, it was found that it is effective to suppress strain energy accumulated in materials at a low level in order to suppress the driving force for crystal growth during heating.

The present invention has been made based on the above-described findings, and a pure copper sheet of the present invention has a composition including 99.96 mass % or more of Cu, 9.0 mass ppm or more and less than 100.0 mass ppm of a total content of Ag, Sn, and Fe and inevitable impurities as a balance, in which an average crystal grain size of crystal grains on a rolled surface is 10.0 μm or more, the pure copper sheet has crystals in which crystal planes parallel to the rolled surface are a {022} plane, a {002} plane, a {113} plane, a {111} plane, and a {133} plane, and, when diffraction peak intensities of the individual crystal planes that are obtained by X-ray diffraction measurement by a 2θ/θ method on the rolled surface are each represented by I {022}, I {002}, I {113}, I {111}, and I {133}, I {022}/(I {022}+I {002}+I {113}+I {111}+I {133}) ≤0.15,
I {002}/I {111}≥10.0, and
I {002}/I {113}≥15.0
are satisfied.

According to the pure copper sheet having this configuration, since the pure copper sheet has a composition in which the content of Cu is set to 99.96 mass % or more, the total content of Ag, Sn, and Fe is set to 9.0 mass ppm or more and less than 100.0 mass ppm, and the balance is inevitable impurities, it becomes possible to suppress the coarsening of crystal grains by the formation of solid solutions of Ag, Sn, and Fe in the matrix of copper. In addition, it is possible to ensure the electrical conductivity of the pure copper sheet and to use the pure copper sheet as a material for members for electric and electronic devices for high-current uses and members for heat radiation.

In addition, since the average crystal grain size of the crystal grains on the rolled surface is set to 10.0 μm or more, the grain sizes are relatively large in a state before heating, the driving force for recrystallization during heating is small, and it becomes possible to suppress grain growth.

In addition, since the diffraction peak intensities I {022}, I {002}, I {113}, I {111}, and I {133} of the individual crystal planes that are obtained by X-ray diffraction measurement by the 2θ/θ method on the rolled surface have the above-described relationships, accumulated strain energy is small, the driving force for recrystallization during heating is small, and it becomes possible to suppress grain growth.

Here, in the pure copper sheet of the present invention, it is preferable that a content of S is set in a range of 2.0 mass ppm or more and 20.0 mass ppm or less.

In this case, 2.0 mass ppm or more of S, which is a crystal grain growth-suppressing element, is contained, whereby it becomes possible to reliably suppress the crystal grains becoming coarse or nonuniform even after the heat treatment. In addition, when the content of S is limited to 20.0 mass ppm or less, it is possible to sufficiently ensure hot workability.

In addition, in the pure copper sheet of the present invention, it is preferable that a total content of Mg, Sr, Ba, Ti, Zr, Hf, and Y is 15.0 mass ppm or less.

There is a concern that elements such as Mg, Sr, Ba, Ti, Zr, Hf, and Y that may be contained as inevitable impurities may generate a compound with the crystal grain coarsening-suppressing element that suppresses the coarsening of the crystal grains by being segregated in the crystal grain boundaries (S, Se, Te, or the like) and may impair the action of the crystal grain growth-suppressing elements. Therefore, when the total content of Mg, Sr, Ba, Ti, Zr, Hf, and Y is limited to 15.0 mass ppm or less, it is possible to make the crystal grain growth-suppressing effect of the crystal grain growth-suppressing elements sufficiently exhibited, and it becomes possible to reliably suppress the crystal grains becoming coarse or nonuniform even after the heat treatment. It should be noted that the crystal grain coarsening-suppressing element (S, Se, Te, or the like) is contained as an inevitable impurity.

Furthermore, in the pure copper sheet of the present invention, it is preferable that a ratio $d_{max}/d_{ave}$ of a maximum crystal grain size $d_{max}$ to an average crystal grain size $d_{ave}$ within a range of 50 mm×50 mm after a heat treatment of holding the pure copper sheet at 800° C. for 1 hour is 20.0 or less and the average crystal grain size $d_{ave}$ is 500 μm or less.

In this case, even in a case where the pure copper sheet is heated under the above-described conditions, it is possible to reliably suppress the crystal grains becoming coarse and nonuniform, and it is possible to further suppress the occurrence of poor appearance.

Furthermore, in the pure copper sheet of the present invention, it is preferable that a Vickers hardness is 150 HV or less.

In this case, since the Vickers hardness is 150 HV or less, the pure copper sheet is sufficiently soft, and characteristics as a pure copper sheet are ensured, the pure copper sheet is particularly suitable as a material for electrical and electronic components for high-current uses.

A copper/ceramic joined body of the present invention includes the above-described pure copper sheet and a ceramic member, the pure copper sheet and the ceramic member formed by joining to each other.

According to the copper/ceramic joined body having this structure, even in a case where the pure copper sheet and the ceramic member are subjected to a pressure heat treatment in order to be joined, the crystal grains of the pure copper sheet becoming locally coarse are suppressed, and it becomes possible to suppress the occurrence of poor joining, poor appearance, or defects in the inspection step.

A copper/ceramic joined body of the present invention includes the above-described pure copper sheet and a ceramic member, the pure copper sheet and the ceramic member formed by joining to each other.

According to the insulated circuit substrate having this structure, even in a case where the pure copper sheet and the ceramic substrate are subjected to a pressure heat treatment in order to be joined, the crystal grains of the pure copper sheet becoming locally coarse are suppressed, and it becomes possible to suppress the occurrence of poor joining, poor appearance, or defects in the inspection step.

Advantageous Effects of Invention

According to the present invention, it is possible to provide a pure copper sheet having a high electrical conductivity and capable of suppressing crystal grains becoming coarse and nonuniform even after a heat treatment and a copper/ceramic joined body and an insulated circuit substrate for which this pure copper sheet is used.

BRIEF DESCRIPTION OF THE DRAWING

The FIGURE is a flowchart of a method for manufacturing a pure copper sheet according to the present embodiment.

DETAILED DESCRIPTION OF THE INVENTION

Hereinafter, a pure copper sheet according to an embodiment of the present invention will be described.

A pure copper sheet, which is the present embodiment, is used as a material for electrical and electronic components such as heat sinks or thick copper circuits and is used in a state of being joined to, for example, a ceramic substrate at the time of molding the above-described electrical and electronic components.

The pure copper sheet, which is the present embodiment, has a composition in which the content of Cu is set to 99.96 mass % or more, the total content of Ag, Sn, and Fe is set to 9.0 mass ppm or more and less than 100.0 mass ppm, and the balance is inevitable impurities. Hereinafter, there are cases where "mass %" and "mass ppm" are each expressed as "%" and "ppm".

It should be noted that, in the pure copper sheet, which is the present embodiment, it is preferable that the content of S is set in a range of 2.0 mass ppm or more and 20.0 mass ppm or less.

In addition, in the pure copper sheet, which is the present embodiment, it is preferable that the total content of Mg, Sr, Ba, Ti, Zr, Hf, and Y (A element group) is 15.0 mass ppm or less.

In addition, in the pure copper sheet, which is the present embodiment, the average crystal grain size of crystal grains on a rolled surface is set to 10.0 μm or more. The average crystal grain size of the crystal grains on the rolled surface can be, for example, the average value of the grain sizes of crystals that are measured at three or more places at equal distances from the center of the rolled surface.

In addition, in the pure copper sheet, which is the present embodiment, a crystal plane parallel to the rolled surface has crystals that are a {022} plane, a {002} plane, a {113} plane, a {111} plane, and a {133} plane, and, when the diffraction peak intensities of the individual crystal planes that are obtained by X-ray diffraction measurement by the 2θ/θ method on the rolled surface are each represented by I {022}, I {002}, I {113}, I {111}, and I {133}, the following relational formulae (1) to (3) are satisfied.

$$I\{022\}/(I\{022\}+I\{002\}+I\{113\}+I\{111\}+I\{133\}) \leq 0.15 \quad (1),$$

$$I\{002\}/I\{111\} \geq 10.0 \quad (2),$$

$$I\{002\}/I\{113\} \geq 15.0 \quad (3)$$

It should be noted that, in the pure copper sheet, which is the present embodiment, it is preferable that the ratio $d_{max}/d_{ave}$ of the maximum crystal grain size $d_{max}$ to the average crystal grain size $d_{ave}$ within a range of 50 mm×50 mm after a heat treatment of holding the pure copper sheet at 800° C. for 1 hour is 20 or less and the average crystal grain size $d_{ave}$ is 500 μm or less. The maximum crystal grain size $d_{max}$ is preferably the largest one of the grain sizes of crystals measured in at least three places in a range that is a selected range with an arbitrary area of 50 mm×50 mm.

In addition, in the pure copper sheet, which is the present embodiment, it is preferable that the Vickers hardness is 150 HV or less.

Furthermore, in the pure copper sheet, which is the present embodiment, it is preferable that the electrical conductivity is 97% IACS or more.

Here, the reasons for specifying the component composition, crystal orientations, and a variety of characteristics as described above in the pure copper sheet of the present embodiment will be described below.

(Purity of Cu: 99.96 Mass % or Higher)

In electrical and electronic components for high-current uses, there is a demand for excellent conductivity and an excellent heat radiation in order to suppress the generation of heat during electrical conduction, and pure copper that is particularly excellent in terms of the conductivity and the heat radiation is preferably used. In addition, in the case of being joined to a ceramic substrate or the like, it is preferable that the pure copper sheet has a small deformation resistance such that thermal strain generated during loading of thermal cycle can be relaxed.

Therefore, in the pure copper sheet, which is the present embodiment, the purity of Cu is specified as 99.96 mass % or higher.

It should be noted that the purity of Cu is preferably 99.965 mass % or higher and more preferably 99.97 mass % or higher. In addition, the upper limit of the purity of Cu is not particularly limited, but is preferably set to 99.999 mass % or lower since, in a case where the upper limit exceeds 99.999 mass %, a special refining step is required, and the manufacturing cost significantly increases.

(Total Content of Ag, Sn, and Fe: 9.0 Mass ppm or More and Less than 100.0 Mass ppm)

Ag, Sn, and Fe are elements having an action of suppressing the coarsening of the crystal grains by forming solid solutions in the copper matrix.

Therefore, in a case where the total content of Ag, Sn, and Fe is set to 9.0 mass ppm or more in the present embodiment, it is possible to make the crystal grain coarsening-suppressing effect of Ag, Sn, and Fe sufficiently exhibited, and it becomes possible to reliably suppress the crystal grains becoming coarse even after the heat treatment. On the other hand, since there is a concern that the addition of the elements more than necessary may cause an increase in the manufacturing cost or a decrease in the electrical conductivity, the total content of Ag, Sn, and Fe is set to less than 100.0 mass ppm.

It should be noted that the lower limit of the total content of Ag, Sn, and Fe is preferably 9.5 mass ppm or more and more preferably 10.0 mass ppm or more. On the other hand, the upper limit of the total content of Ag, Sn, and Fe is preferably less than 80.0 mass ppm and more preferably less than 60.0 mass ppm. In addition, particularly, Sn and Fe, which significantly decrease the electrical conductivity, are preferably less than 30.0 mass ppm in total.

(Content of S: 2.0 Mass ppm or More and 20.0 Mass ppm or Less)

S is an element that has an action of suppressing the coarsening of crystal grains by suppressing the movement of crystal grain boundaries and degrades hot workability.

Therefore, in a case where the content of S is set to 2.0 mass ppm or more in the present embodiment, it is possible for the crystal grain coarsening-suppressing effect of S to be sufficiently exhibited, and it becomes possible to reliably suppress crystal grains becoming coarse even after the heat treatment. On the other hand, in a case where the content of S is limited to 20.0 mass ppm or less, it becomes possible to ensure hot workability.

It should be noted that the lower limit of the content of S is preferably 2.5 mass ppm or more and more preferably 3.0 mass ppm or more. In addition, the upper limit of the content of S is preferably 17.5 mass ppm or less and more preferably 15.0 mass ppm or less.

(Total Content of Mg, Sr, Ba, Ti, Zr, Hf, Y (a Element Group): 15.0 Mass ppm or Less)

There is a concern that one or more selected from Mg, Sr, Ba, Ti, Zr, Hf, and Y (A element group) that are contained as inevitable impurities may generate a compound with the crystal grain coarsening-suppressing element that suppresses the coarsening of the crystal grains by being segregated in the crystal grain boundaries (S, Se, Te, or the like) and may impair the action of the crystal grain coarsening-suppressing elements.

Therefore, in order to reliably suppress the coarsening of crystal grains after the heat treatment, the total content of Mg, Sr, Ba, Ti, Zr, Hf, and Y (A element group) is preferably set to 15.0 mass ppm or less.

It should be noted that the total content of Mg, Sr, Ba, Ti, Zr, Hf, and Y (A element group) is preferably 10.0 mass ppm or less, more preferably 7.5 mass ppm or less, and most preferably 5.0 mass ppm or less.

(Other Elements)

It should be noted that Al, Cr, P, Be, Cd, Mg, Ni, and Pb (M element group) have an effect of suppressing grain growth by the formation of solid solutions in the copper matrix, segregation in the grain boundaries, and, furthermore, the formation of oxides.

Therefore, in order to reliably suppress the coarsening of the crystal grains after the heat treatment, more than 2.0 mass ppm of Al, Cr, P, Be, Cd, Mg, Ni, and Pb (M element group) in total are preferably contained. It should be noted that, in the case of intentionally containing Al, Cr, P, Be, Cd, Mg, Ni, and Pb (M element group), the lower limit of the total content of Al, Cr, P, Be, Cd, Mg, Ni, and Pb (M element group) is more preferably set to 2.1 mass ppm or more, still more preferably set to 2.3 mass ppm or more, far still more preferably set to 2.5 mass ppm or more, and optimally set to 3.0 mass ppm or more.

On the other hand, when Al, Cr, P, Be, Cd, Mg, Ni, and Pb (M element group) are contained more than necessary, since there is a concern that the electrical conductivity may decrease, the upper limit of the total content of Al, Cr, P, Be, Cd, Mg, Ni, and Pb (M element group) is preferably set to less than 100.0 mass ppm, more preferably set to less than 50.0 mass ppm, far more preferably less than 20.0 mass ppm, and still far more preferably set to less than 10.0 mass ppm.

(Other Inevitable Impurities)

As other inevitable impurities other than the above-described elements, B, Bi, Ca, Sc, rare earth elements, V, Nb, Ta, Mo, W, Mn, Re, Ru, Os, Co, Rh, Ir, Pd, Pt, Au, Zn, Hg, Ga, In, Ge, As, Sb, Tl, N, C, Si, Li, H, O, and the like are exemplary examples. It is preferable to reduce these inevitable impurities since there is a concern that the inevitable impurities may decrease the electrical conductivity.

(Average Crystal Grain Size of Crystal Grains on Rolled Surface: 10 μm or More)

In the pure copper sheet, which is the present embodiment, when the average crystal grain size of the crystal grains on the rolled surface is fine, at the time of heating this pure copper sheet, recrystallization is likely to proceed, and there is a concern that the growth of the crystal grains and the structure becoming nonuniform may be accelerated.

Therefore, in order to further suppress the coarsening of the crystal grains during heating, the average crystal grain size of the crystal grains on the rolled surface is preferably set to 10 μm or more.

It should be noted that the average crystal grain size of the crystal grains on the rolled surface is preferably 15 μm or more and more preferably 20 μm or more.

$$(I\{022\}/(I\{022\}+I\{002\}+I\{113\}+I\{111\}+I\{133\}) \leq 0.15)$$

In the rolled surface, a {220} plane is a crystal orientation that is formed during rolling, and, as the ratio of the {220} plane increases, strain energy accumulated in the material becomes higher. Here, when the strain energy accumulated in the material is high, the driving force at the time of causing recrystallization becomes high, and the crystal grains are likely to become coarse during heating.

Therefore, in order to suppress the coarsening of the crystal grains, in the present embodiment, I {022}/(I {022}+I {002}+I {113}+I {111}+I {133})) is set to 0.15 or less.

Here, (I {022}/(I {022}+I {002}+I {113}+I {111}+I {133}) is preferably 0.12 or less and more preferably 0.10 or less.

$$(I\{002\}/I\{111\} \geq 10.0, I\{002\}/I\{113\} \geq 15.0)$$

Since a {002} plane is a crystal orientation that is formed during recrystallization, an increase in the orientation ratio to the {111} plane or the {113} plane, which is likely to be formed during working, suppresses strain energy in the material, which becomes the driving force for recrystallization, and makes it possible to suppress the coarsening of the crystal grains.

Therefore, in the present embodiment, I {002}/I {111} is set to 10.0 or more, and I {002}/I {113} is set to 15.0 or more.

Here, I {002}/I {111} is preferably 11.0 or more and more preferably 12.0 or more. In addition, I {002}/I {113} is preferably 16.0 or more and more preferably 17.0 or more.

(Average Crystal Grain Size after Heat Treatment of Holding Pure Copper Sheet at 800° C. for 1 Hour: 500 μm or Less)

In the pure copper sheet, which is the present embodiment, in a case where the average crystal grain size after the heat treatment of holding the pure copper sheet at 800° C. for 1 hour is 500 μm or less, it is possible to reliably suppress the coarsening of the crystal grains even in the case of heating the pure copper sheet to 800° C. or higher, and the pure copper sheet is particularly suitable as a material for thick copper circuits or heat sinks that are joined to ceramic substrates.

It should be noted that the upper limit of the average crystal grain size after the heat treatment of holding the pure copper sheet at 800° C. for 1 hour is preferably 450 μm or less and more preferably 400 μm or less.

($d_{max}/d_{ave}$ after Heat Treatment of Holding Pure Copper Sheet at 800° C. for 1 Hour: 20.0 or Less)

In the pure copper sheet, which is the present embodiment, in a case where the ratio $d_{max}/d_{ave}$ of the maximum crystal grain size $d_{max}$ to the average crystal grain size $d_{ave}$ within a range of 50 mm×50 mm after the heat treatment of holding the pure copper sheet at 800° C. for 1 hour is 20.0 or less, it is possible to reliably suppress the crystal grains becoming nonuniform even in the case of heating the pure copper sheet to 800° C. or higher, and the pure copper sheet is particularly suitable as a material for thick copper circuits or heat sinks that are joined to ceramic substrates.

It should be noted that the ratio $d_{max}/d_{ave}$ of the maximum crystal grain size $d_{max}$ to the average crystal grain size $d_{ave}$ within a range of 50 mm×50 mm after the heat treatment of holding the pure copper sheet at 800° C. for 1 hour is preferably 18.0 or less and more preferably 15.0 or less.

(Vickers Hardness: 150 HV or Less)

In the pure copper sheet, which is the present embodiment, when the Vickers hardness is set to 150 HV or less, characteristics as a pure copper sheet are ensured, and the pure copper sheet is particularly suitable as a material for electrical and electronic components for high-current uses. In addition, the pure copper sheet is sufficiently soft, and, even in a case where the pure copper sheet is joined to a different member such as a ceramic substrate and loaded with a thermal cycle, it becomes possible to relieve thermal strain generated by the deformation of the pure copper sheet.

It should be noted that the Vickers hardness of the pure copper sheet is more preferably 140 HV or less, still more preferably 130 HV or less, and most preferably 110 HV or less. The lower limit of the Vickers hardness of the pure copper sheet is not particularly limited; however, in a case where the hardness is too low, since the pure copper sheet is likely to deform during manufacturing and becomes hard to handle, the Vickers hardness is preferably 30 HV or more, more preferably 45 HV or more, and most preferably 60 HV or more.

(Electrical Conductivity: 97% IACS or More)

In the pure copper sheet, which is the present embodiment, when the electrical conductivity is set to 97% IACS or more, characteristics as a pure copper sheet are ensured, and the pure copper sheet is particularly suitable as a material for members for electric and electronic devices for high-current uses and members for heat radiation.

It should be noted that the electrical conductivity of the pure copper sheet is preferably 98% IACS or more and more preferably 99% IACS or more. The upper limit of the electrical conductivity of the pure copper sheet is not particularly limited.

Next, a method for manufacturing the pure copper sheet, which is the present embodiment configured as described above, will be described with reference to a flowchart shown in the FIGURE.

(Melting and Casting Step S01)

First, a copper raw material is melted to produce molten copper. It should be noted that, as the copper raw material, for example, 4NCu having a purity of 99.99 mass % or higher or 5NCu having a purity of 99.999 mass % or higher is preferably used.

It should be noted that, in the case of adding S, it is possible to use a S single body, a Cu—S mother alloy, or the like. It should be noted that, in the case of manufacturing a Cu—S mother alloy as well, 4NCu having a purity of 99.99 mass % or higher and 5NCu having a purity of 99.999 mass % or higher is preferably used.

In addition, in the melting step, atmosphere melting using an inert gas atmosphere in which the vapor pressure of $H_2O$ is low (for example, Ar gas) is performed in order to decrease the hydrogen concentration, and the retention time during melting is preferably kept to the minimum.

In addition, the molten copper having an adjusted component is injected into a casting mold to produce an ingot. It should be noted that, in the case of taking mass production into account, a continuous casting method or a semi-continuous casting method is preferably used.

(Hot Working Step S02)

Next, hot working is performed to make the structure uniform.

The hot working temperature is not particularly limited, but is preferably set in a range of 500° C. or higher and 1000° C. or lower.

In addition, the total working rate of the hot working is preferably set to 50% or more, more preferably set to 60% or more, and still more preferably 70% or more.

Furthermore, the cooling method after the hot working is not particularly limited, but air cooling or water cooling is preferably performed.

In addition, the working method in the hot working step S02 is not particularly limited, and it is possible to adopt, for example, rolling, extrusion, groove rolling, forging, pressing, or the like. In a case where the final shape is a sheet or a strip, rolling is preferably adopted, and, in a case where the final shape is a bulk material, forging or pressing is preferably adopted.

(Intermediate Rolling Step S03)

Next, intermediate rolling is performed on the copper material that has been subjected to the hot working step S02 to work the copper material into a predetermined shape. It should be noted that the temperature condition in the intermediate rolling step S03 is not particularly limited, but the intermediate rolling step is preferably performed in a range of −200° C. or higher and 200° C. or lower. In addition, the working rate in the intermediate rolling step S03 is appropriately selected so as to work the copper material into a shape similar to the final shape, and the working rate is preferably set to 30% or more in order to improve the productivity.

(Recrystallization Heat Treatment Step S04)

Next, a heat treatment is performed on the copper material that has been subjected to the intermediate rolling step S03 for the objective of recrystallization. Here, the average crystal grain size of recrystallized grains on the rolled surface is desirably 10 μm or more. When the recrystallized grains are fine, there is a concern that, when the copper material is heated to 800° C. or higher afterwards, the growth of the crystal grains and the structure becoming nonuniform may be accelerated.

The heat treatment conditions in the recrystallization heat treatment step S04 are not particularly limited, but the copper material is preferably held at a heat treatment temperature in a range of 200° C. or higher and 900° C. or lower for a range of 1 second or longer and 10 hours or shorter.

Examples thereof include a heat treatment at 350° C. for 6 h, a heat treatment at 700° C. for 1 minute, a heat treatment at 850° C. for 5 seconds, and the like.

In addition, in order to make the recrystallization structure uniform, the intermediate rolling step S03 and the recrystallization heat treatment step S04 may be repeated twice or more.

(Temper Rolling Step S05)

Next, temper rolling may be performed on the copper material that has been subjected to the recrystallization heat treatment step S04 in order to adjust the material strength. It should be noted that, in a case where there is no need to increase the material strength, temper rolling may not be performed.

The working rate of the temper rolling is not particularly limited, but temper rolling is preferably performed at a working rate in a range of more than 0% and 50% or less in order to adjust the material strength. Furthermore, in a case where the material strength is further decreased, and I $\{022\}/(I\{022\}+I\{002\}+I\{113\}+I\{111\}+I\{133\})$ is set to 0.15 or less, and in a case where I $\{002\}/I\{111\}$ is set to 10 or more and I $\{002\}/I\{113\}$ is set to 15 or more, the working rate is more preferably limited to more than 0% and 40% or less.

In addition, if necessary, a heat treatment may be further performed after the temper rolling in order to remove residual strain.

The pure copper sheet, which is the present embodiment, is produced by each of the above-described steps.

According to the pure copper sheet, which is the present embodiment configured as described above, since the pure copper sheet has a composition in which the content of Cu is set to 99.96 mass % or more, the total content of Ag, Sn, and Fe is set to 9.0 mass ppm or more and less than 100.0 mass ppm, and the balance is inevitable impurities, it becomes possible to suppress the coarsening of crystal grains by the formation of solid solutions of Ag, Sn, and Fe in the matrix of copper.

In addition, since the average crystal grain size of the crystal grains on the rolled surface is set to 10 μm or more, the grain sizes are relatively large in a state before a pressure heat treatment, the driving force for recrystallization during the pressure heat treatment is small, and it becomes possible to suppress grain growth.

In the pure copper sheet, which is the present embodiment, since the diffraction peak intensities I {022}, I {002}, I {113}, I {111}, and I {133} of the individual crystal planes that are obtained by X-ray diffraction measurement by the 2θ/θ method on the rolled surface have a relationship of I {022}/(I 10221+I {002}+I {113}+I 11111+I {133})≤0.15, accumulated strain energy is small, the driving force for recrystallization during heating is small, and it becomes possible to suppress grain growth.

Furthermore, in the pure copper sheet, which is the present embodiment, since I {002}/I {111} is set to 10 or more and I {002}/I {113} is set to 15 or more, the ratio of the {002} plane, which is a crystal orientation that is formed during recrystallization, increases with respect to the {111} plane or the {113} plane that is likely to be formed during working, whereby strain energy in the material, which becomes the driving force for recrystallization during joining, is suppressed, and it becomes possible to suppress the coarsening of the crystal grains.

In addition, in the present embodiment, in a case where the content of S is set in a range of 2.0 mass ppm or more and 20.0 mass ppm or less, S, which is one kind of crystal grain growth-suppressing element, segregates in the grain boundaries, and it becomes possible to reliably suppress the crystal grains becoming coarse and nonuniform during heating. In addition, it is possible to ensure hot workability.

Furthermore, in the present embodiment, in a case where the total content of Mg, Sr, Ba, Ti, Zr, Hf, and Y (A element group) is 15.0 mass ppm or less, it is possible to suppress these elements of the A element group and S, Se, Te, and the like, which are crystal grain growth-suppressing elements, reacting with each other to generate a compound, and it becomes possible to make the action of the crystal grain growth-suppressing elements sufficiently exhibited. Therefore, it becomes possible to reliably suppress the crystal grains becoming coarse and nonuniform during heating.

Furthermore, in the present embodiment, in a case where the ratio $d_{max}/d_{ave}$ of the maximum crystal grain size $d_{max}$ to the average crystal grain size $d_{ave}$ within a range of 50 mm×50 mm after the heat treatment of holding the pure copper sheet at 800° C. for 1 hour is 20.0 or less and the average crystal grain size $d_{ave}$ is 500 μm or less, it is possible to reliably suppress the crystal grains becoming coarse and nonuniform even after the heat treatment, and it is possible to further suppress the occurrence of poor appearance.

In addition, in the present embodiment, in a case where the Vickers hardness is 150 HV or less, since the pure copper sheet is sufficiently soft, and characteristics as a pure copper sheet are ensured, the pure copper sheet is particularly suitable as a material for electrical and electronic components for high-current uses.

Furthermore, in the present embodiment, in a case where more than 2.0 mass ppm of Al, Cr, P, Be, Cd, Mg, Ni, and Pb (M element group) are contained, it becomes possible to more reliably suppress grain growth after the heat treatment by the formation of solid solutions in the matrix, segregation in the grain boundaries, and, furthermore, the formation of oxides by the elements of the M element copper group.

Hitherto, the pure copper sheet, which is the embodiment of the present invention, has been described, but the present invention is not limited thereto and can be appropriately modified within the scope of the technical concept of the invention.

For example, in the above-described embodiment, an example of the method for manufacturing the pure copper sheet has been described, but the method for manufacturing the pure copper sheet is not limited to the manufacturing method described in the embodiment, and the pure copper sheet may be manufactured by appropriately selecting an existing manufacturing method.

EXAMPLES

Hereinafter, the results of confirmatory experiments performed to confirm the effect of the present invention will be described.

A copper raw material having a purity of 99.999 mass % or higher and a Cu-1 mass % mother alloy of a variety of elements produced using the copper raw material and a variety of elements having a purity of 99 mass % or higher were prepared.

The above-described copper raw material was charged into a high-purity graphite crucible and melted with a high frequency in an atmosphere furnace having an Ar gas atmosphere. The above-described Cu-1 mass % mother alloy of the variety of elements was injected into the obtained molten copper to prepare a predetermined component composition.

The obtained molten copper was poured into a casting mold to produce an ingot. It should be noted that the sizes of the ingot were set to a thickness of approximately 100 mm, a width of approximately 120 mm, and a length of approximately 150 to 200 mm.

The obtained ingots were heated in an Ar gas atmosphere for 1 hour at temperatures shown in Tables 1 and 2 and hot-rolled to a thickness of 50 mm.

The copper materials after hot rolling were cut, and surface grinding was performed to remove oxide films on the surfaces. At this time, the thicknesses of the copper materials to be subjected to intermediate rolling were adjusted such that the final thicknesses became as shown in Tables 1 and 2 in consideration of the rolling rates of subsequent hot rolling, intermediate rolling, and temper rolling.

The copper materials having a thickness adjusted as described above were subjected to intermediate rolling under the conditions shown in Tables 1 and 2 and water cooling.

Next, on the copper materials that had been subjected to the intermediate rolling, a recrystallization heat treatment was performed under the conditions shown in Tables 1 and 2.

In addition, on the copper materials that had been subjected to the recrystallization heat treatment, temper rolling was performed under the conditions shown in Tables 1 and 2, thereby manufacturing strip materials for characteristic evaluation having a thickness shown in Tables 3 and 4 and a width of 60 mm.

In addition, evaluation was performed regarding the following items.

(Composition Analysis)

A measurement specimen was collected from the obtained ingot, S was measured by the infrared absorption method, and other elements were measured using a glow discharge mass spectrometer (GD-MS). It should be noted that the measurement was performed at two sites, the central portion of the specimen and an end portion in the width direction, and a larger content was regarded as the content of the sample. The measurement results are shown in Tables 1 and 2.

(Evaluation of Workability)

As the evaluation of the workability, the presence or absence of a cracked edge during the above-described hot rolling and intermediate rolling was observed. A specimen from which a cracked edge was not or rarely recognized visually was evaluated as "A", a specimen in which a cracked edge as small as a length of less than 1 mm was generated was evaluated as "B", and a specimen in which a cracked edge of a length of 1 mm or more was generated was evaluated as "C".

It should be noted that the length of the cracked edge is the length of the cracked edge from an end portion in the width direction to the central portion in the width direction of the rolled material.

(Vickers Hardness)

The Vickers hardness was measured at a test load of 0.98 N in accordance with the micro Vickers hardness test method specified in JIS Z 2244. It should be noted that the measurement position was the rolled surface of the test piece for characteristic evaluation. The evaluation results are shown in Tables 3 and 4.

(Electrical Conductivity)

A test piece having a width of 10 mm and a length of 60 mm was collected from the strip material for characteristic evaluation, and the electric resistance was obtained by the 4-terminal method. In addition, the dimensions of the test piece were measured using a micrometer, and the volume of the test piece was calculated. In addition, the electrical conductivity was calculated from the measured electric resistance value and the measured volume. The evaluation results are shown in Tables 3 and 4.

It should be noted that the test piece was collected such that the longitudinal direction of the test piece became parallel to the rolling direction of the strip material for characteristic evaluation.

(Average Crystal Grain Size Before Heat Treatment of Holding Pure Copper Sheet at 800° C. for 1 Hour)

A 20 mm×20 mm sample was cut out from the obtained strip material for characteristic evaluation, and the average crystal grain size was measured with a SEM-EBSD (Electron Backscatter Diffraction Patterns) measuring instrument.

A rolled surface was mechanically polished using waterproof abrasive paper and diamond abrasive grains, and then finish-polished using a colloidal silica solution. After that, individual measurement points (pixels) in a measurement range on the specimen surface were irradiated with electron beams using an electron scanning microscope, and, by orientation analysis by backscatter electron diffraction, a region between adjacent measurement points where the orientation angle between the measurement points became 15° or more was regarded as a large-angle grain boundary, and a region where the orientation angle was less than 15° was regarded as a small-angle grain boundary. A crystal grain boundary map was produced using the large-angle grain boundaries, according to a cutting method of JIS H 0501, 5 vertical line segments having a predetermined length and 5 horizontal line segments having a predetermined length were drawn on the crystal grain boundary map, the number of crystal grains that were fully cut was counted, and the average value of the cut lengths was described as the crystal grain size before the heat treatment. The evaluation results are shown in Tables 3 and 4.

(X-Ray Diffraction Intensity)

The X-ray diffraction intensity I {111} from a {111} plane on the sheet surface, the X-ray diffraction intensity I {002} from a {002} plane, the X-ray diffraction intensity I {022} from a {022} plane, the X-ray diffraction intensity I {113} from a {113} plane, and the X-ray diffraction intensity I {133} from a {133} plane were measured by the following procedure using the integrated intensity method.

A measurement specimen was collected from a strip material for characteristic evaluation, and the X-ray diffraction intensities around one rotation axis were measured with respect to the measurement specimen by the reflection method. Cu was used as the target, and X-rays of K$\alpha$ were used. The X-ray diffraction intensities were measured under conditions of a tube current of 40 mA, a tube voltage of 40 kV, a measurement angle of 40° to 150°, and a measurement step of 0.02°, the background of the X-ray diffraction intensities was removed from a profile of the diffraction angle and the X-ray diffraction intensity, and then the integrated X-ray diffraction intensity was obtained by combining K$\alpha$1 and K$\alpha$2 of a peak from each diffraction plane.

In addition, I {022}/(I {022}+I {002}+I {113}+I {111}+I {133}), I {002}/I {111}, and I {002}/I {113} were calculated.

(Average Crystal Grain Size after Heat Treatment of Holding Pure Copper Sheet at 800° C. for 1 Hour)

A 60 mm×60 mm sample was cut out from the above-described strip material for characteristic evaluation, and a heat treatment was performed by holding the sample at 800° C. for 1 hour. A 50 mm×50 mm sample was cut out from this test piece, the rolled surface was mirror-polished and etched, and captured with an optical microscope such that the rolling direction was along the side of the photograph. In the observed portion, a portion in which crystal grains were finest and formed in a uniform grain size in a visual field of approximately 1 mm 2 was selected, and observation and measurement were performed. In addition, regarding crystal grain sizes, in accordance with the cutting method of JIS H 0501, 5 vertical line segments having a predetermined length and 5 horizontal line segments having a predetermined length were drawn on the photograph, the number of crystal grains that were fully cut was counted, and the average value of the cut lengths was written as the average crystal grain size $d_{ave}$ after the heat treatment. The evaluation results are shown in Tables 3 and 4.

(Dispersion in Average Grain Size after Heat Treatment of Holding Pure Copper Sheet at 800° C. for 1 Hour)

As described above, in a sample collected from a test piece on which a heat treatment had been performed, when the average value of the major axis of the most coarse crystal grain in a range of 50 mm×50 mm except for twin crystals and the minor axis that was cut by grain boundaries at the time of drawing a line perpendicular to the major axis was defined as the maximum crystal grain size $d_{max}$, a case where the ratio $d_{max}/d_{ave}$ of this maximum crystal grain size to the above-described average crystal grain size $d_{ave}$ was 15.0 or less was evaluated as "A", a case where $d_{max}/d_{ave}$ was more than 15.0 and 20.0 or less was evaluated as "B", and a case where $d_{max}/d_{ave}$ exceeded 20.0 was evaluated as "C".

TABLE 1

| | | Component composition (mass ratio) | | | | | Manufacturing steps | | | | | |
| --- | --- | --- | --- | --- | --- | --- | --- | --- | --- | --- | --- | --- |
| | | | | | | | Hot rolling | Intermediate rolling | Recrystallization heat treatment | | Temper rolling Rolling | |
| | | Cu % | Ag + Sn + S ppm | Fe ppm | A element group ppm | M element group ppm | Temperature ° C. | Rolling rate % | Temperature ° C. | Time sec. | rate % | Thickness mm |
| Present Invention Example | 1 | 99.96 or more | 6.5 | 11.5 | 4.6 | 2.3 | 800 | 90 | 800 | 10 | 10 | 1.0 |
| | 2 | 99.96 or more | 5.5 | 9.1 | 3.1 | 2.7 | 800 | 90 | 400 | 1800 | 40 | 0.5 |
| | 3 | 99.96 or more | 7.9 | 9.6 | 4.9 | 2.7 | 800 | 90 | 600 | 10 | 30 | 2.0 |
| | 4 | 99.96 or more | 5.5 | 10.1 | 4.3 | 2.8 | 800 | 90 | 500 | 300 | 30 | 2.0 |
| | 5 | 99.96 or more | 6.4 | 12.5 | 4.8 | 2.1 | 800 | 92 | 350 | 10 | 42 | 1.5 |
| | 6 | 99.96 or more | 4.9 | 12.0 | 4.2 | 2.4 | 800 | 92 | 375 | 20 | 45 | 1.0 |
| | 7 | 99.96 or more | 7.0 | 12.2 | 4.5 | 2.7 | 800 | 90 | 360 | 60 | 35 | 1.5 |
| | 8 | 99.96 or more | 7.0 | 11.1 | 4.3 | 2.6 | 800 | 90 | 380 | 300 | 51 | 2.0 |
| | 9 | 99.96 or more | 7.1 | 10.9 | 3.7 | 2.5 | 800 | 90 | 400 | 20 | 48 | 0.5 |
| | 10 | 99.96 or more | 6.6 | 11.4 | 4.1 | 2.6 | 800 | 90 | 450 | 10 | 51 | 1.5 |
| | 11 | 99.96 or more | 4.7 | 13.7 | 4.9 | 2.4 | 800 | 90 | 500 | 10 | 49 | 2.0 |
| | 12 | 99.96 or more | 7.4 | 11.8 | 3.6 | 2.7 | 800 | 90 | 450 | 30 | 50 | 1.0 |
| | 13 | 99.96 or more | 5.1 | 10.9 | 3.8 | 2.2 | 800 | 90 | 450 | 15 | 45 | 0.5 |
| | 14 | 99.96 or more | 0.3 | 10.3 | 3.2 | 2.5 | 800 | 90 | 350 | 3600 | 30 | 2.0 |
| | 15 | 99.96 or more | 2.2 | 12.1 | 4.4 | 2.6 | 800 | 90 | 500 | 5 | 32 | 2.0 |
| | 16 | 99.96 or more | 2.5 | 11.9 | 4.0 | 2.7 | 800 | 90 | 600 | 30 | 12 | 0.5 |
| | 17 | 99.96 or more | 27.0 | 10.7 | 3.5 | 2.0 | 800 | 90 | 650 | 10 | 15 | 1.0 |
| | 18 | 99.96 or more | 19.5 | 12.4 | 4.2 | 2.4 | 800 | 90 | 650 | 20 | 12 | 1.0 |

A element group: One or more selected from Mg, Sr, Ba, Ti, Zr, Hf, and Y
M element group: One or more selected from Al, Cr, P, Be, Cd, Mg, Ni, and Pb

TABLE 2

| | | Component composition (mass ratio) | | | | | Manufacturing steps | | | | | |
| --- | --- | --- | --- | --- | --- | --- | --- | --- | --- | --- | --- | --- |
| | | | | | | | Hot rolling | Intermediate rolling Rolling | Recrystallization heat treatment | | Temper rolling Rolling | |
| | | Cu % | Ag + Sn + S ppm | Fe ppm | A element group ppm | M element group ppm | Temperature ° C. | rate % | Temperature ° C. | Time sec. | rate % | Thickness mm |
| Present Invention Example | 19 | 99.96 or more | 16.8 | 12.2 | 4.9 | 2.9 | 800 | 90 | 550 | 60 | 18 | 1.5 |
| | 20 | 99.96 or more | 6.6 | 11.2 | 7.4 | 2.3 | 800 | 90 | 500 | 180 | 20 | 1.5 |
| | 21 | 99.96 or more | 5.2 | 11.6 | 9.7 | 3.0 | 800 | 90 | 550 | 30 | 22 | 2.0 |
| | 22 | 99.96 or more | 6.2 | 12.7 | 15.5 | 2.6 | 800 | 90 | 350 | 600 | 45 | 0.5 |
| | 23 | 99.96 or more | 5.6 | 13.2 | 4.8 | 2.6 | 800 | 90 | 600 | 20 | 5 | 1.5 |
| | 24 | 99.96 or more | 7.3 | 12.1 | 5.0 | 2.7 | 800 | 88 | 650 | 600 | 10 | 2.0 |
| | 25 | 99.96 or more | 5.1 | 11.2 | 4.6 | 2.6 | 800 | 88 | 550 | 40 | 8 | 2.0 |
| | 26 | 99.96 or more | 6.8 | 12.6 | 4.3 | 2.3 | 800 | 88 | 700 | 60 | 40 | 0.5 |

TABLE 2-continued

| | | Component composition (mass ratio) | | | | | Manufacturing steps | | | | | |
| --- | --- | --- | --- | --- | --- | --- | --- | --- | --- | --- | --- | --- |
| | | | | | | | | Intermediate | Recrystallization | | Temper | |
| | | | Ag + Sn + Cu % | S ppm | Fe ppm | A element group ppm | M element group ppm | Hot rolling Temperature ° C. | rolling Rolling rate % | heat treatment Temperature ° C. | Time sec. | rolling Rolling rate % | Thickness mm |
| | 27 | 99.96 or more | 5.5 | 12.8 | 3.8 | 1.7 | 800 | 90 | 400 | 60 | 20 | 1.0 |
| Comparative Example | 1 | 99.96 or more | 3.2 | 4.6 | 2.8 | 2.7 | 800 | 92 | 350 | 10 | 30 | 1.0 |
| | 2 | 99.96 or more | 2.0 | 610.2 | 1.2 | 0.2 | 800 | 90 | 500 | 10 | 30 | 1.0 |
| | 3 | 99.96 or more | 5.2 | 10.2 | 4.3 | 2.6 | 800 | 90 | 375 | 30 | 80 | 0.5 |

A element group: One or more selected from Mg, Sr, Ba, Ti, Zr, Hf, and Y
M element group: One or more selected from Al, Cr, P, Be, Cd, Mg, Ni, and Pb

TABLE 3

| | | | Vickers hardness | Electrical conductivity | Crystal orientation on rolled surface | | | Before heat treatment Average crystal grain size | After heat treatment | |
| --- | --- | --- | --- | --- | --- | --- | --- | --- | --- | --- |
| | | | | | | | | | Average crystal grain size | Dispersion in grain |
| | | Workability | HV | % IACS | Formula (1) | Formula (2) | Formula (3) | μm | μm | size |
| Present Invention Example | 1 | A | 83 | 100 | 0.06 | 17.7 | 22.5 | 38 | 276 | A |
| | 2 | B | 104 | 98 | 0.10 | 12.6 | 17.2 | 32 | 411 | A |
| | 3 | B | 97 | 99 | 0.09 | 13.3 | 17.6 | 30 | 394 | A |
| | 4 | B | 96 | 99 | 0.09 | 13.2 | 17.4 | 36 | 377 | A |
| | 5 | A | 112 | 98 | 0.10 | 12.0 | 17.0 | 11 | 493 | B |
| | 6 | A | 113 | 98 | 0.10 | 12.5 | 17.3 | 15 | 440 | A |
| | 7 | A | 106 | 99 | 0.09 | 13.5 | 18.3 | 21 | 409 | A |
| | 8 | A | 115 | 98 | 0.12 | 12.2 | 17.1 | 23 | 487 | A |
| | 9 | A | 113 | 98 | 0.11 | 12.1 | 17.3 | 24 | 422 | A |
| | 10 | A | 115 | 98 | 0.10 | 10.3 | 17.2 | 28 | 467 | A |
| | 11 | A | 113 | 98 | 0.10 | 11.2 | 17.0 | 31 | 434 | A |
| | 12 | A | 114 | 98 | 0.10 | 12.3 | 15.1 | 25 | 476 | A |
| | 13 | A | 112 | 98 | 0.10 | 12.0 | 16.3 | 26 | 416 | A |
| | 14 | A | 100 | 99 | 0.09 | 13.2 | 18.7 | 32 | 403 | A |
| | 15 | A | 102 | 99 | 0.09 | 13.9 | 18.9 | 30 | 381 | A |
| | 16 | A | 88 | 100 | 0.06 | 16.6 | 20.3 | 37 | 339 | A |
| | 17 | B | 88 | 100 | 0.07 | 18.6 | 21.3 | 42 | 235 | A |
| | 18 | B | 83 | 100 | 0.06 | 18.2 | 22.0 | 46 | 240 | A |

Formula (1): I {022}/(I {022} + I {002} + I {113} + I {133})
Formula (2): I {002}/I {111}
Formula (3): I {002}/I {113}

TABLE 4

| | | | Vickers hardness | Electrical conductivity | Crystal orientation on rolled surface | | | Before heat treatment Average crystal grain size | After heat treatment | |
| --- | --- | --- | --- | --- | --- | --- | --- | --- | --- | --- |
| | | | | | | | | | Average crystal grain size | Dispersion in grain |
| | | Workability | HV | % IACS | Formula (1) | Formula (2) | Formula (3) | μm | μm | size |
| Present Invention Example | 19 | B | 90 | 100 | 0.07 | 17.6 | 22.2 | 33 | 316 | A |
| | 20 | A | 91 | 98 | 0.08 | 15.3 | 18.6 | 30 | 411 | A |
| | 21 | A | 93 | 99 | 0.08 | 14.9 | 18.6 | 29 | 437 | A |
| | 22 | A | 112 | 98 | 0.10 | 12.6 | 17.2 | 22 | 462 | A |
| | 23 | A | 78 | 101 | 0.05 | 18.3 | 23.2 | 42 | 84 | A |
| | 24 | A | 83 | 100 | 0.06 | 17.2 | 23.0 | 84 | 123 | A |

TABLE 4-continued

|   |   | Workability | Vickers hardness HV | Electrical conductivity % IACS | Crystal orientation on rolled surface | | | Before heat treatment Average crystal grain size μm | After heat treatment | |
|---|---|---|---|---|---|---|---|---|---|---|
|   |   |   |   |   | Formula (1) | Formula (2) | Formula (3) |   | Average crystal grain size μm | Dispersion in grain size |
|   | 25 | A | 80 | 100 | 0.06 | 17.6 | 21.9 | 65 | 89 | A |
|   | 26 | A | 108 | 98 | 0.10 | 13.0 | 17.4 | 89 | 243 | A |
|   | 27 | A | 90 | 98 | 0.08 | 15.4 | 19.0 | 27 | 381 | A |
| Comparative Example | 1 | A | 101 | 98 | 0.10 | 12.5 | 17.3 | 8 | 516 | C |
|   | 2 | A | 104 | 86 | 0.08 | 12.6 | 17.6 | 27 | 332 | A |
|   | 3 | A | 122 | 97 | 0.17 | 6.5 | 10.6 | 12 | 683 | C |

Formula (1): I {022}/(I {022} + I {002} + I {113} + I {133})
Formula (2): I {002}/I {111}
Formula (3): I {002}/I {113}

In Comparative Example 1, since the total content of Ag, Sn, and Fe was smaller than the range of the present invention and the average crystal grain size before the heat treatment of holding the pure copper sheet at 800° C. for 1 hour was less than 10 μm, the average crystal grain size became as coarse as 500 μm or more after the heat treatment of holding the pure copper sheet at 800° C. for 1 hour, and the dispersion in the grain size also became large.

In Comparative Example 2, the total content of Ag, Sn, and Fe was larger than the range of the present invention, and the electrical conductivity became low.

In Comparative Example 3, since I {022}/(I {022}+I {002}+I {113}+I {111}+I {133}) exceeded 0.15, I {002}/I {111} was less than 10, and I {002}/I {113} was less than 15, the crystal grains became coarse after the heat treatment, and the dispersion in the grain size also became large.

In contrast, in Present Invention Examples 1 to 28, the average crystal grain sizes after the heat treatment were small, and the dispersions in the grain size also became small. In addition, the electrical conductivity also became 97% IACS or more.

From the above-described results, it was confirmed that, according to the present invention examples, it is possible to provide a pure copper sheet having excellent conductivity and capable of suppressing crystal grains becoming coarse and nonuniform even after a heat treatment.

What is claimed is:

1. A pure copper sheet having a composition comprising:
   99.96 mass % or more of Cu;
   9.0 mass ppm or more and less than 100.0 mass ppm of a total content of Ag, Sn, and Fe; and
   inevitable impurities as a balance,
   wherein an average crystal grain size of crystal grains on a rolled surface is 10 μm or more,
   the pure copper sheet has crystals in which crystal planes parallel to the rolled surface are a {022} plane, a {002} plane, a {113} plane, a {111} plane, and a {133} plane, and
   when diffraction peak intensities of the individual crystal planes that are obtained by X-ray diffraction measurement by a 2θ/θ method on the rolled surface are each represented by I {022}, I {002}, I {113}, I {111}, and I {133},
   I {022}/(I {022}+I {002}+I {113}+I {111}+I {133}) ≤0.15,
   I {002}/I {111} ≥10.0, and
   I {002}/I {113} ≥15.0 are satisfied.

2. The pure copper sheet according to claim 1, wherein a content of S is in a range of 2.0 mass ppm or more and 20.0 mass ppm or less.

3. The pure copper sheet according to claim 1, wherein a total content of Mg, Sr, Ba, Ti, Zr, Hf, and Y is 15.0 mass ppm or less.

4. The pure copper sheet according to claim 1, wherein a ratio $d_{max}/d_{ave}$ of a maximum crystal grain size $d_{max}$ to an average crystal grain size $d_{ave}$ in a range of 50 mm×50 mm after a heat treatment of holding the pure copper sheet at 800° C. for 1 hour is 20.0 or less and the average crystal grain size $d_{ave}$ is 500 μm or less.

5. The pure copper sheet according to claim 1, wherein a Vickers hardness is 150 HV or less.

6. A copper/ceramic joined body comprising:
   the pure copper sheet according to claim 1; and
   a ceramic member, the pure copper sheet and the ceramic member formed by bonding to each other.

7. An insulated circuit substrate comprising:
   the pure copper sheet according to claim 1 formed by bonding to a surface of a ceramic substrate.

* * * * *